United States Patent [19]

Miller

[11] Patent Number: 5,706,323

[45] Date of Patent: Jan. 6, 1998

[54] DYNAMIC 1-OF-$2^N$ LOGIC ENCODING

[75] Inventor: Robert H. Miller, Loveland, Colo.

[73] Assignee: Hewlett-Packard Company, Palo Alto, Calif.

[21] Appl. No.: 609,305

[22] Filed: Mar. 1, 1996

[51] Int. Cl.[6] .................................................. G11C 19/00
[52] U.S. Cl. ............................ 377/73; 377/81; 327/407; 327/410; 327/333
[58] Field of Search ...................... 377/73, 81; 327/407, 327/410, 333

[56] References Cited

U.S. PATENT DOCUMENTS

| | | | |
|---|---|---|---|
| 3,743,948 | 7/1973 | Dahlin et al. | 377/75 |
| 4,565,934 | 1/1986 | Southerland, Jr. | 377/81 |
| 5,150,389 | 9/1992 | Kawasaki | 377/73 |
| 5,208,490 | 5/1993 | Yetter | 307/452 |
| 5,243,599 | 9/1993 | Barrett et al. | 327/407 |
| 5,295,174 | 3/1994 | Shimizu | 377/81 |
| 5,488,318 | 1/1996 | Vajapey et al. | 377/73 |
| 5,534,798 | 7/1996 | Phillips et al. | 327/410 |

Primary Examiner—Margaret Rose Wambach

[57] ABSTRACT

A system of encoding a plurality of logic paths. A number of logic paths are subdivided into groups of N, N being greater than one. Each group of N logic paths is encoded such that an assertion of a given combination of the N logic paths results in a predetermined one out of $2^N$ signal lines being asserted. Simultaneous assertion of more than one of the $2^N$ signal lines is defined as an invalid state. A simultaneous non-assertion of all of the $2^N$ signal lines enables precharging of the signal lines for dynamic operation. 1-of-$2^N$ encoding enables transmission of N variables by firing one out of N wires (rather than every wire, as in static logic, or one out of two wires, as in mousetrap logic). Signal degradation due to noise and coupling is reduced. In a multiplexer, 1-of-$2^N$ encoding reduces the load on the multiplexer's shift lines. Several 1-of-$2^N$ encoded multiplexers may be interconnected to form a self-timed dynamic shift register comprising one or more stages of tiered multiplexers. 1-of-$2^N$ encoding enables closer wire routings within such a shift register. Furthermore, 1-of-$2^N$ encoding can reduce the number of multiplexers required to implement a shift function.

15 Claims, 9 Drawing Sheets

| VARIABLES | | 1-OF-2$^N$ | | | | MOUSETRAP | | | |
|---|---|---|---|---|---|---|---|---|---|
| A[4] | A[5] | A[4,5] | | | | A[4] | | A[5] | |
| | | 0 | 1 | 2 | 3 | H | L | H | L |
| 0 | 0 | 1 | 0 | 0 | 0 | 0 | 1 | 0 | 1 |
| 0 | 1 | 0 | 1 | 0 | 0 | 0 | 1 | 1 | 0 |
| 1 | 0 | 0 | 0 | 1 | 0 | 1 | 0 | 0 | 1 |
| 1 | 1 | 0 | 0 | 0 | 1 | 1 | 0 | 1 | 0 |
| — | | ALL 0 = PRECHARGE | | | | ALL 0 = PRECHARGE | | ALL 0 = PRECHARGE | |
| — | | ANY TWO 1 = INVALID | | | | ANY TWO 1 = INVALID | | ANY TWO 1 = INVALID | |

DYNAMIC 1-OF-$2^N$ LOGIC ENCODING

BACKGROUND OF THE INVENTION

This invention pertains to dynamic logic encoding, and more particularly, to a practical self-timed dynamic shift register using 1-of-$2^N$ encoding.

Signal noise, line loading, and line coupling all contribute to signal degradation and are the cause of much concern in the production of VLSI (very large scale integrated) circuits. The effects of these phenomena are especially troublesome in the design of circuitry comprising numerous closely packed signal lines, such as shift registers, buses and the like.

A shift register is a device used within a digital computer (or similar device) to shift a number of bits from one to many places to the left or right. During a shift, additional bits (usually bits of meaningful data and/or information) are shifted into freed-up bit positions.

Since shift registers are required to operate at very fast speeds, they are usually implemented using dynamic logic. Dynamic logic can operate at much higher speeds than static logic.

One type of dynamic logic which is frequently used in shift registers is known as "mousetrap" logic. A detailed description of this logic can be derived from U.S. Pat. No. 5,208,490 to Yetter, which is hereby incorporated by reference for all that it discloses. As taught in Yetter's patent, mousetrap logic is a form of vector logic. In a vector logic system, any number of valid vector logic states, and one invalid vector logic state, are defined by the logic signals carried on a set of logic paths. An invalid vector logic state is defined as a state wherein all logic paths exhibit a low logic signal. A valid vector logic state is preferably defined by a state wherein one and only one of said logic paths exhibits a high logic signal. A mousetrap logic gate has an arming mechanism, ladder logic, and a buffer. A precharge is supplied by the arming mechanism to the buffer. Incoming logic signals are operated upon by the ladder logic, and are used to trigger the precharged buffer. Each mousetrap gate is self-timed, in that no output exists until all necessary valid inputs are present.

Although mousetrap logic and mousetrap logic gates have resulted in significantly improved shift registers, problems still remain. First, to carry out a single shift, exactly half of the shift amount and data inputs of a mousetrap-implemented shift register must be asserted. As a result, half of the wires in the shift register will be carrying signals, and a significant number of "nearest neighbor" and "double nearest neighbor" firings will result (a nearest neighbor firing is defined as the firing of a wire which is adjacent to a non-firing wire; a double nearest neighbor firing is defined as the firing of two wires which are adjacent to a non-firing wire (e.g., two firing wires located on opposite sides of a non-firing wire)). When "nearest neighbor" and "double nearest neighbor" firings occur, degradation of non-firing signals due to noise and line coupling is greatly increased.

Second, each shift amount input must drive a minimum of four gates in each one-bit multiplexer of a shift stage (data is usually shifted in stages—a common arrangement for shifting a 64-bit word is to shift in multiples of sixteen bits in the first stage, multiples of four bits in the second stage, and multiples of one bit in the third stage). The shift lines are therefore heavily loaded. Heavy loading leads to increased power consumption.

It is therefore a primary object of this invention to provide a system of encoding logic signals which decreases the load on, and coupling between, signal lines.

It is also a primary object of this invention to provide a system of logic encoding which yields a decrease in signal noise.

It is a further object of this invention to provide a system of logic encoding which decreases power consumption.

It is yet another object of this invention to provide a system of logic encoding which enables tighter wire routing, and consequently, the production of smaller circuits.

It is also an object of this invention to provide a system of logic encoding which results in faster signal propagation through a hierarchy of wiring intensive logic circuits.

SUMMARY OF THE INVENTION

In the achievement of the foregoing objects, the inventor has devised an alternative method of encoding a plurality of logic paths (a logic path is defined as a collection of wires needed to transmit a single logic variable). A number of logic paths are subdivided into groups of N, N being greater than one. Each group of N logic paths is encoded such that an assertion of a given combination of the N logic paths results in a predetermined one out of $2^N$ signal lines being asserted. Simultaneous assertion of more than one of the $2^N$ signal lines is defined as an invalid state. A simultaneous non-assertion of all of the $2^N$ signal lines enables precharging of the signal lines for dynamic operation.

When encoding two variables (N=2), 1-of-$2^N$ encoding enables transmission of a variable by firing one out of four wires (rather than the one out of two required in a mousetrap system). With only 1-of-$2^N$ wires firing, wires may be strategically routed so as to reduce the frequency of nearest neighbor firings, and even eliminate double nearest neighbor firings. This in turn reduces signal degradation due to noise and coupling.

In a multiplexer comprising a plurality of data inputs and shift amount inputs, each input comprising a group of $2^N$ signal wires, and N being an integer greater than one equaling a number of variables encoded in 1-of-$2^N$ format on the $2^N$ signal wires, 1-of-$2^N$ encoding reduces the load on the multiplexer's shift lines.

Several 1-of-$2^N$ encoded multiplexers may be interconnected to form a self-timed dynamic shift register comprising one or more stages of tiered multiplexers. The fewer number of wire firings which results from 1-of-$2^N$ encoding enables closer wire routings within such a shift register. Furthermore, 1-of-$2^N$ encoding can reduce the number of multiplexers required to implement a shift function. With fewer multiplexers, and closely packed wire routings, signals may propagate through a shift register more quickly.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawing in which:

FIG. 3 is a truth table illustrating conversions from single rail logic to 1-of-$2^N$ logic to mousetrap logic;

DESCRIPTION OF THE PREFERRED EMBODIMENT

Figure 9:
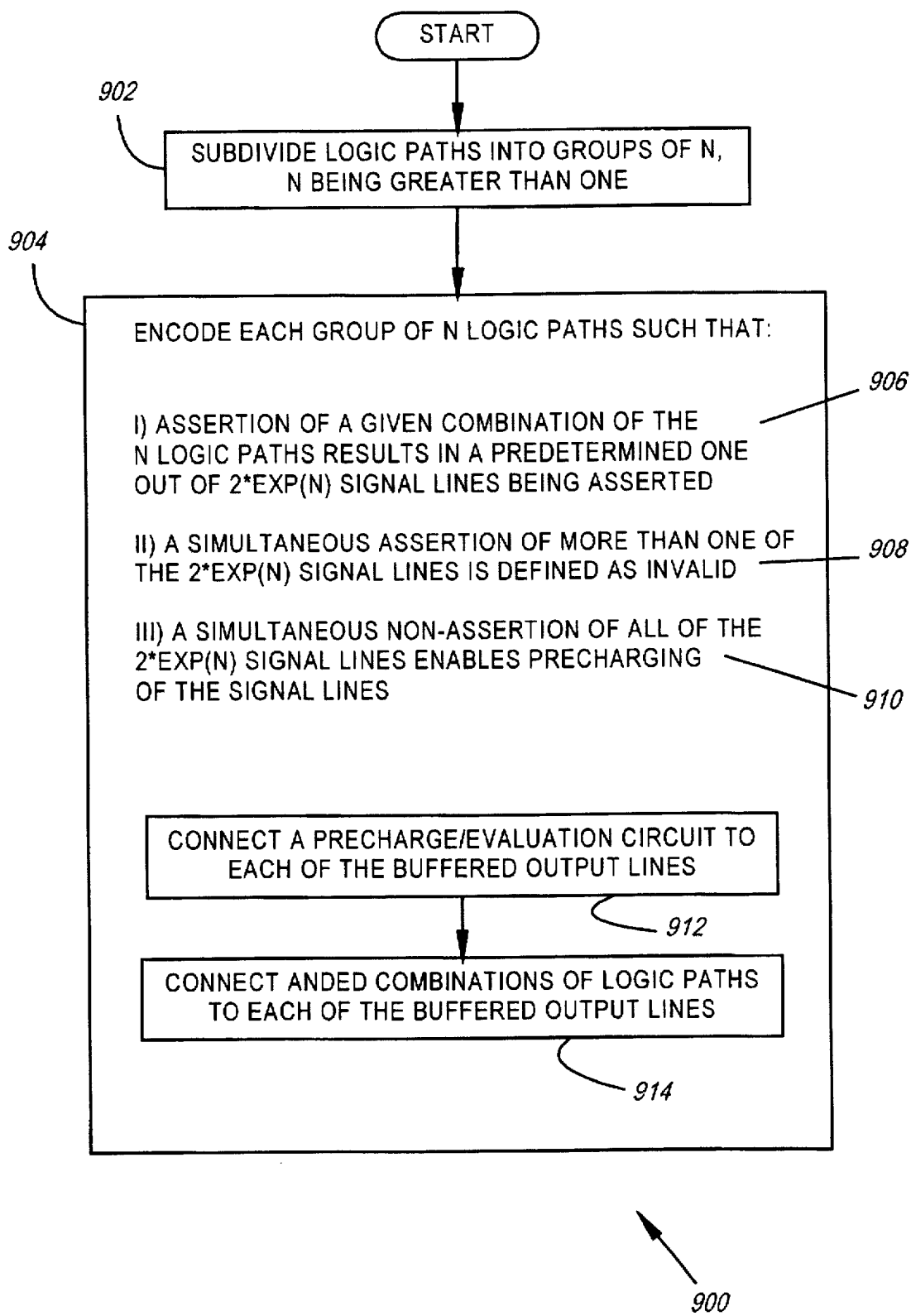
FIG. 9 is a flow chart illustrating a method of encoding a plurality of logic paths in 1-of-$2^N$ format.

A method 900 of encoding a plurality of logic paths in 1-of-$2^N$ format is illustrated in the flow chart of FIG. 9. The method 900 generally comprises the steps of subdividing 902 the logic paths into groups of N logic paths, N being greater than one, and then encoding 904 each group of N logic paths such that 1) assertion of a given combination of the N logic paths results in a predetermined one out of $2^N$ signal lines being asserted 906, 2) a simultaneous assertion of more than one of the $2^N$ signal lines is defined as invalid 908, and 3) a simultaneous non-assertion of all of the $2^N$ signal lines enables precharging of the signal lines 910.

A multiplexer 402 implementing 1-of-$2^N$ logic encoding may generally comprise a plurality of data inputs 448, 450, 452, 454 and shift amount inputs 418. Each input comprises a group of $2^N$ signal wires, where N is an integer greater than one which is equal to a number of variables encoded in 1-of-$2^N$ format on a group of $2^N$ signal wires.

A self-timed dynamic shift register 400 implementing 1-of-$2^N$ logic encoding may generally comprise one or more stages 428, 430, 432 of tiered multiplexers 402, 404, 405, 406, 407 coupled to perform a shift function. Each of the multiplexers 402, 404, 405, 406, 407 may in turn comprise a plurality of data inputs 448, 450, 452, 454 and shift amount inputs 418, wherein various of said inputs comprise groups of $2^N$ signal wires. Again, N is an integer greater than one which is equal to a number of variables encoded in 1-of-$2^N$ format on a group of $2^N$ signal wires.

Having thus described a system of dynamic 1-of-$2^N$ logic encoding in general, the system will now be described in further detail.

Figure 1:
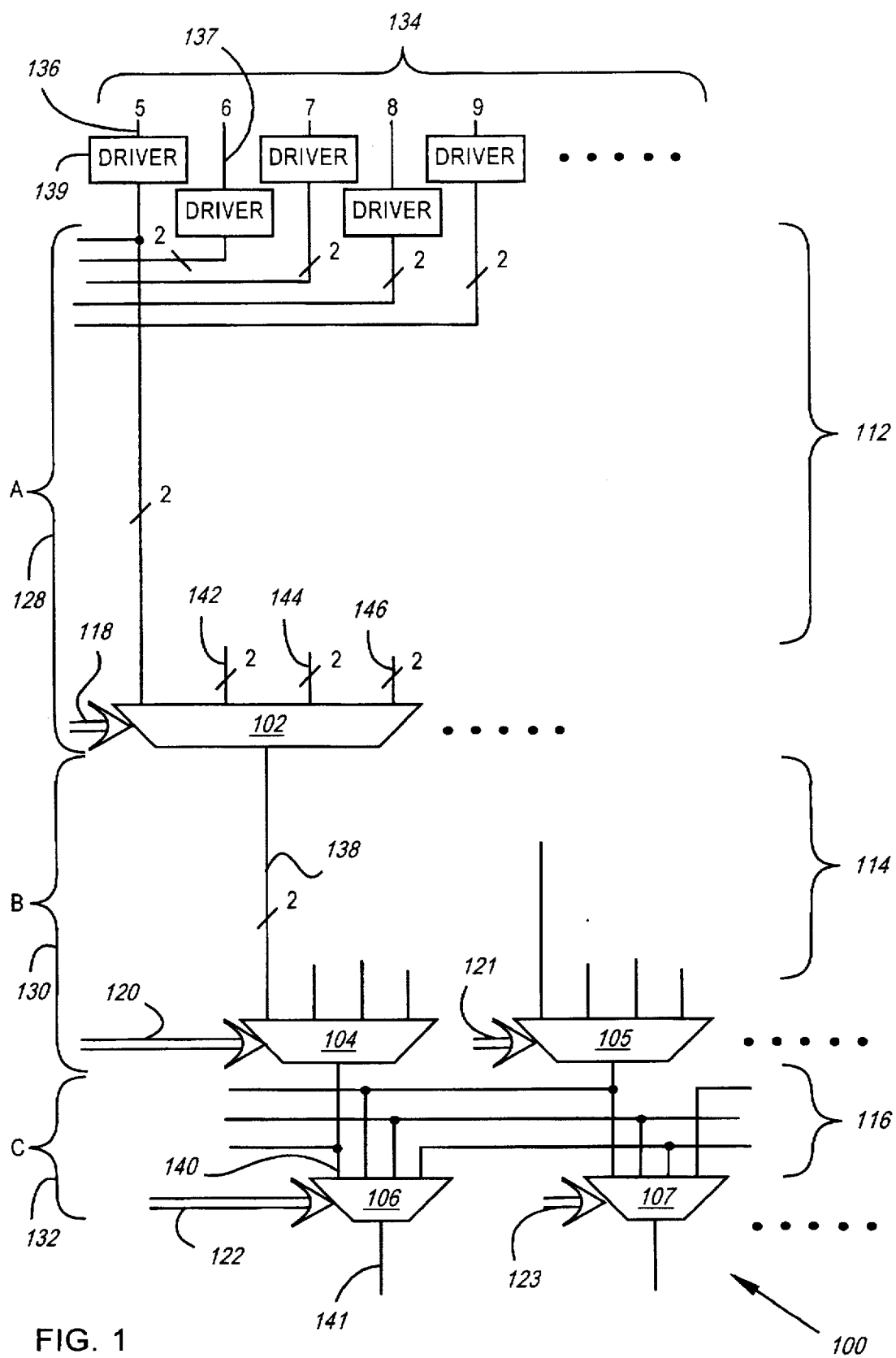
FIG. 1 is a schematic illustrating the general layout of a shift register implemented using mousetrap logic.

As stated above, 1-of-$2^N$ encoding is of particular use in self-timed dynamic shift registers 100, 400. FIG. 1 illustrates the general layout of a shift register 100. In the figure, data 112, 114, 116 enters a number of multiplexers 102, 104, 105, 106, 107 from above, and shift select lines 118, 120, 121, 122, 123 enter the multiplexers 102, 104, 105, 106, 107 from the left. The shift register 100 is divided into stages 128, 130, 132, denoted in the figure as stages A, B and C. Assuming that a 64-bit word (and consequently, 64 data lines 134) comes into the shift register 100, stage A might be designated as a "shift 16" or S16 stage. Stage B might be a "shift 4" or S4 stage, and stage C might be a "shift 1" or S1 stage. Bit five 136 of a word (input into the shift register via an appropriate driver 139) could be shifted to bit twenty-one, bit thirty-seven or bit fifty-three in stage A of the shift register 100. Assuming that bit five 136 is shifted to bit twenty-one 138 in stage A, stage B allows the bit 138 to be shifted to bit twenty-five, bit twenty-nine, or bit thirty-three. Assuming a stage B shift to bit twenty-nine 140, the bit 140 can then be shifted to bit thirty, bit thirty-one, or bit thirty-two before being output 141 from the shift register 100. Note that the three stages 128, 130, 132 of shift allow sixty-three bits of a 64-bit word to be "shifted out" of the shift register 100. Additional shifting would only result in an overshift.

Note that the wiring density 112, 114, 116 between stages 128, 130, 132 gets progressively lighter from stage A to B to C.

Figure 2:
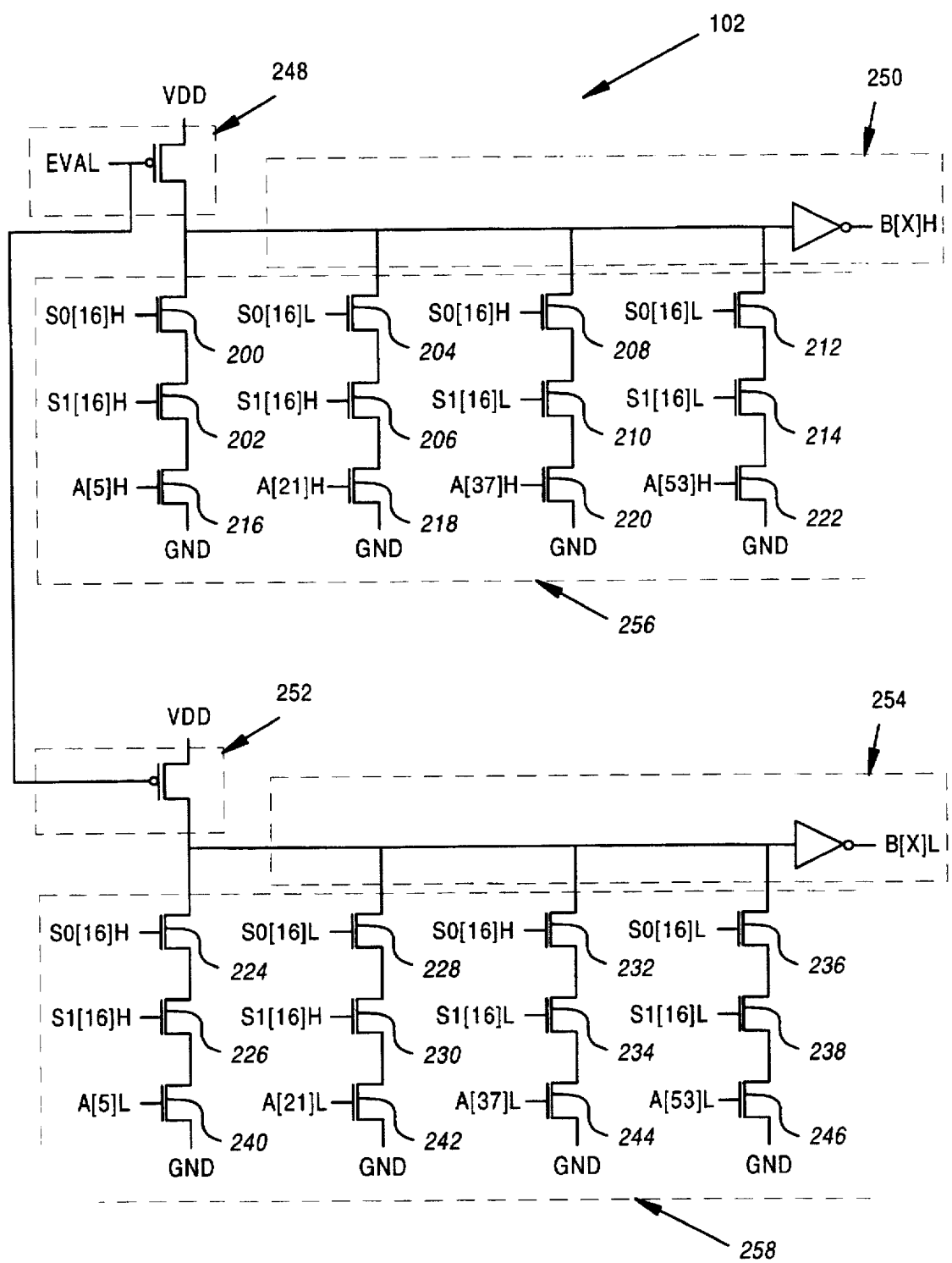
FIG. 2 is a schematic illustrating an S16 one-bit multiplexer of the type used in the shift register of FIG. 1.

In a conventional mousetrap shift register 100, each of the data bits 134 is represented by a pair of wires. Likewise, each of a multiplexer's one or more select lines 118, 120, 121, 122, 123 is represented by a wire pair. A single one-bit S16 multiplexer 102 might therefore appear as in FIG. 2. The notation used to identify shift amount inputs (shift select lines 118) is "SelectLineName[ShiftMultiple] MousetrapRail", where SelectLineName is either S0 or S1 (enabling four possible shift amounts), ShiftMultiple is either 16 (shift 16), 4 (shift 4) or 1 (shift 1), and MousetrapRail is either H (high) or L (low). The notation used to identify data inputs 136, 137 is "Stage[Bit]MousetrapRail", where Stage is A, B or C, Bit designates a bit of a word (form 0 to 63 for a 64-bit word), and MousetrapRail is again H or L.

Note that a one-bit S16 multiplexer 102 requires logic blocks 256, 258 comprising twenty-four transistors 200–246. Also note that each shift select line 118 entering the multiplexer 102 has a load of four gates (e.g., line S0[16]H connects to four transistors 200, 208, 224, 232). Furthermore, a buffered output line 250, 254 (or multiplexer output 138) which has been precharged using a suitable precharge/evaluate circuit 248, 252 can only be asserted by pulling down the line 250, 254 through an ANDed combination of three transistors (e.g., 200, 202, 216).

In 1-of-$2^N$ encoding, N logic variables are encoded on $2^N$ wires. Thus, two data lines are encoded on $2^2$=4, wires, three data lines are encoded on $2^3$=8 wires, and so on. A truth table 300 showing the possible logic combinations for two logic variables, A[4] and A[5], is illustrated in FIG. 3 (the first two columns 302). The encoding of these combinations on $2^N$ wires is shown in columns three through six 304 of the figure. For purpose of comparison, columns seven through ten 306 show the mousetrap encoding for the two variables. Note that in encoding two variables, 1-of-$2^N$ encoding of a pair of variables requires the same number of wires as would an individual encoding of the variables using mousetrap logic. However, one important advantage of this invention can already be appreciated. In 1-of-$2^N$ encoding, only half as many wires as would be required in mousetrap logic must be asserted in order to pass two variables to another stage of a circuit. For the two variables of FIG. 3, 1-of-$2^N$ encoding requires the firing of one wire, whereas mousetrap logic requires the firing of two wires. As in mousetrap logic, however, the validity of variables is assured in that the firing of more than one of the $2^N$ wires indicates an invalid state (an "I forgot" state). When all wires are low, a system may be precharged for subsequent evaluation (an "I don't know yet" state).

If only one of $2^N$ wires needs to fire (rather than the one of two required in mousetrap logic), wires may be made smaller, and may be routed in closer proximity to one another. There is less of a problem with noise since 1) only half as many wires are firing, 2) the firing wires are smaller, and 3) wires may routed so that nearest neighbor firings, and particularly double nearest neighbor firings (i.e., a situation wherein wires fire on two sides of an adjacent non-firing wire), are less likely to occur.

Figure 4:
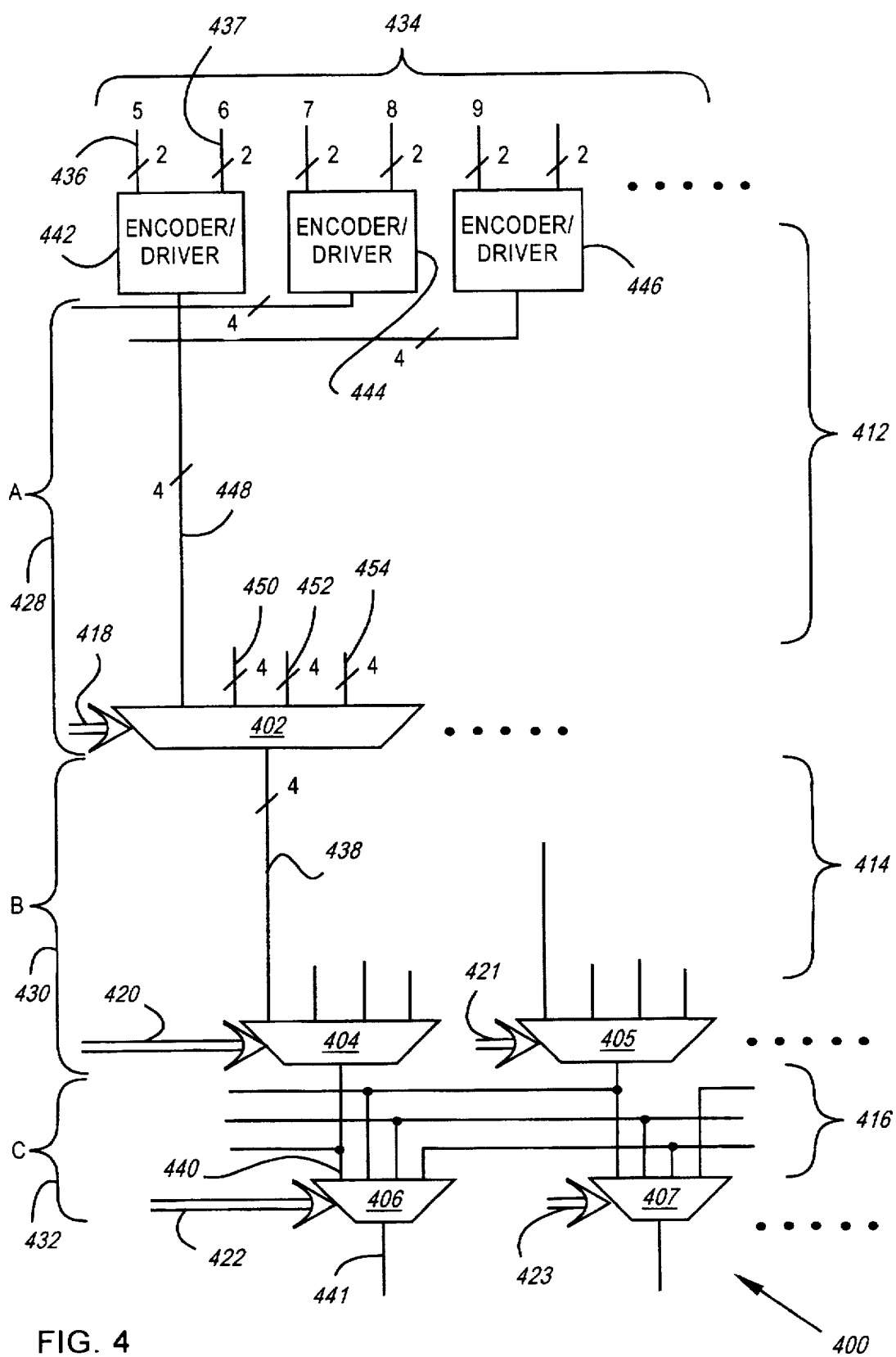
FIG. 4 is a schematic illustrating the general layout of a shift register implemented using 1-of-$2^N$ logic encoding.
Figure 5:
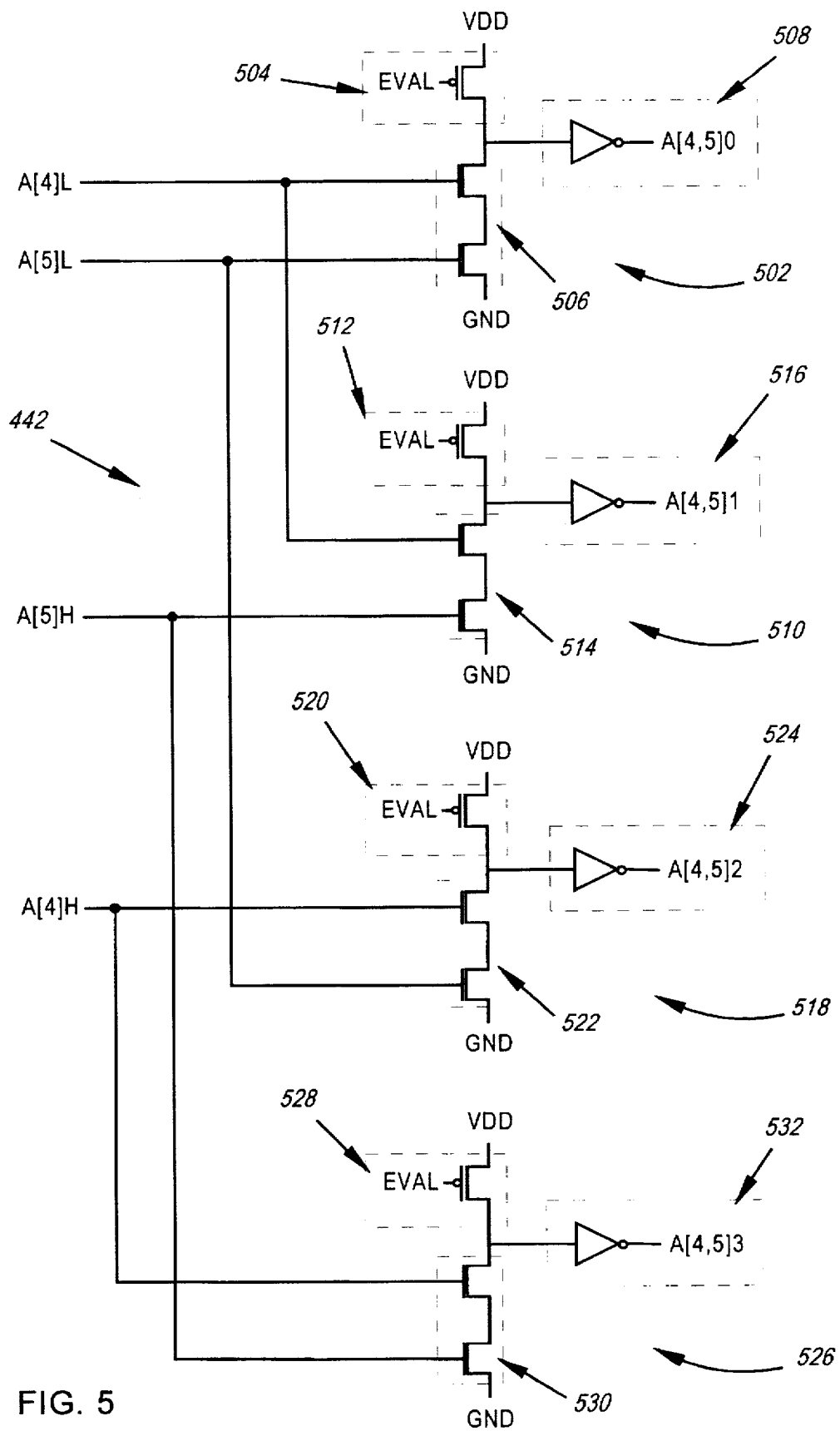
FIG. 5 is a schematic illustrating circuitry for encoding mousetrap logic paths as 1-of-$2^N$ logic paths.
Figure 6:
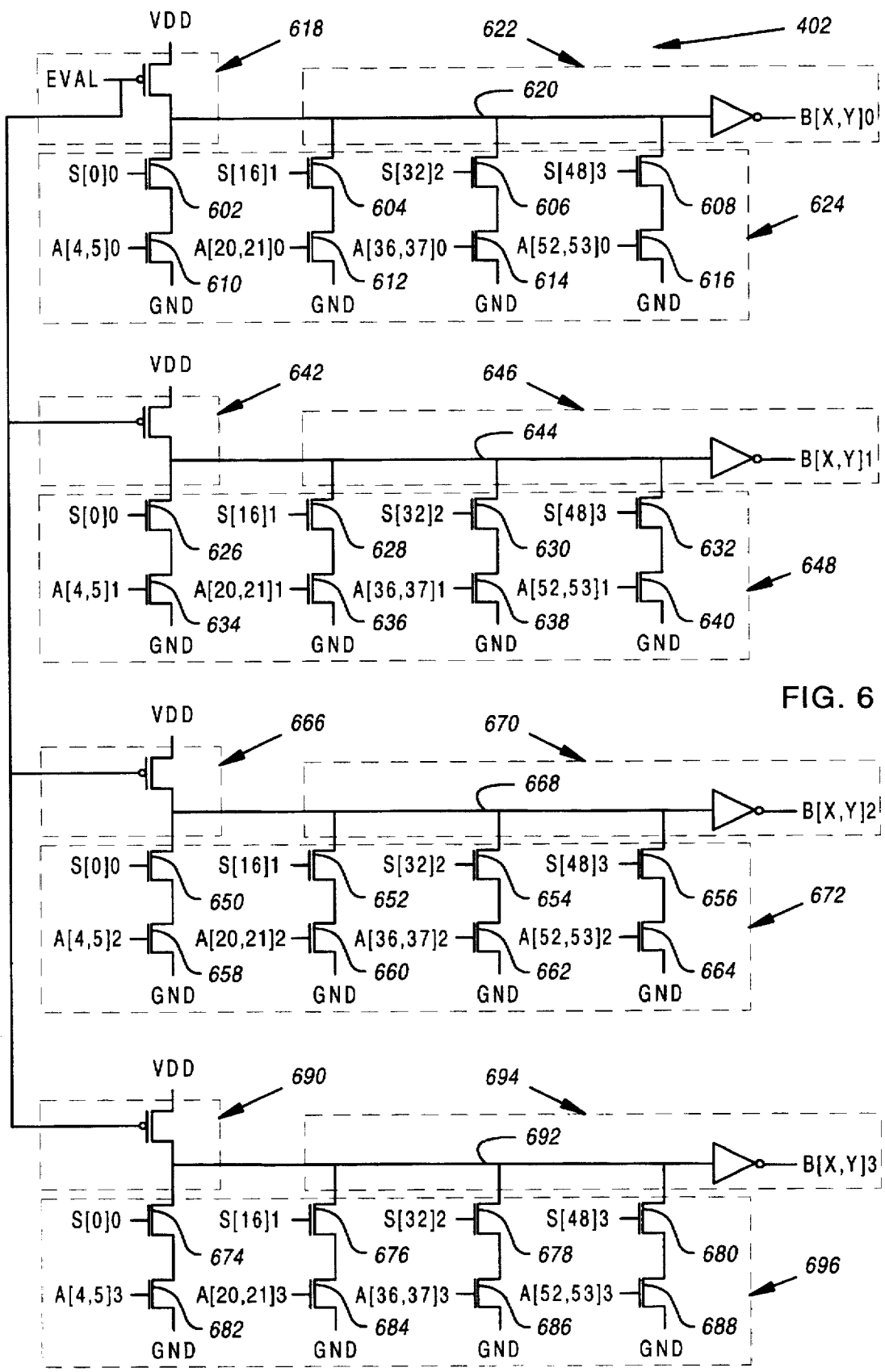
FIG. 6 is a schematic illustrating an S16 two-bit multiplexer of the type used in the shift register of FIG. 5.

A preferred embodiment of a 1-of-$2^N$ encoded shift register 400 is illustrated in FIG. 4. Like the mousetrap shift register 100 of FIG. 1, the 1-of-$2^N$ encoded shift register 400 shown in FIG. 4 is designed to shift a 64-bit word 434. Note that data inputs 436, 437 are encoded 442, 444, 446 in groups of two 448, 450, 452, 454 before entering the shift stages 428, 430, 432. While 1-of-$2^N$ encoding is particularly advantageous in wiring intensive devices operating on variables which can be encoded in groups of two or more, 1-of-$2^N$ encoding may be cumbersome in other areas of a circuit. As a result, logic paths 436,437 preceding a device such as a 1-of-$2^N$ encoded shift register 400 may be encoded in other forms (e.g., mousetrap logic 306). It is therefore necessary to convert from the "other forms" 306 into 1-of-$2^N$ logic 304. Circuitry 442 enabling conversion of two logic paths (designated A[4] and A[5]) into 1-of-$2^N$ form is illustrated in FIG. 5.

Shift amount inputs 418 are identified in FIGS. 5-8 using the notation "S[ShiftAmount]LineNumber", where S designates a shift signal, ShiftAmount is a multiple of 16 (shift 16), 4 (shift 4) or 1 (shift 1), and LineNumber designates one of $2^N$ signal lines (wires). The notation used to identify data inputs 448, 450, 452, 454 and/or outputs 438, 440, 441 is "Stage[Bits]LineNumber", where Stage is A, B or C, Bits designates the names of N encoded bits, and LineNumber again designates one of $2^N$ signal lines.

The encoder circuitry 442, 444, 446 is rather simple, and does not significantly detract from the performance advantages of 1-of-$2^N$ logic, as it may be integrated into the already necessary line drivers 139 shown in FIG. 1. In short, the conversion/encoding logic 502, 510, 518, 526 comprises ANDed combinations of mousetrap signals 506, 514, 522, 530 connected 912, 914 (FIG. 9) to suitable precharge circuits 504, 512, 520, 528 and buffered output lines 508, 516, 524, 532. As will be demonstrated later in this specification, ORed precharge logic 704, 712, 720, 728 may be used to convert from 1-of-$2^N$ logic 304 back to mousetrap logic 306.

As shown in FIGS. 1 & 4, shift registers 100, 400 are essentially a combination of tiered multiplexers 402, 404, 405, 406, 407. Each multiplexer comprises data inputs 448, 450, 452, 454, shift amount inputs 418, and an output 438. For the purpose of examining the benefits of 1-of-$2^N$ encoding, a shift 16 (S16) multiplexer 402 using 1-of-$2^N$ logic will be examined in greater detail.

While typical multiplexers 102 use shift amount inputs 118 to select a one-bit output 138 from one of many data inputs 136, 142, 144, 146, a multiplexer 402 using 1-of-$2^N$ logic uses its shift amount inputs 418 to select an N-bit output 438 from its many N-bit "encoded" data inputs 448, 450, 452, 454.

In addition to encoding a multiplexer's data inputs 448, 450, 452, 454, shift amount inputs 418, 420, 421, 422, 423 may also be encoded. With 1-of-$2^N$ encoded data 448-454 and shift amount inputs 418, a two-bit S16 multiplexer 402 might have the transistor implementation shown in FIG. 6. Another advantage of 1-of-$2^N$ encoding may now be appreciated. The encoding of shift lines 418 reduces the number of ANDed transistors (e.g., 602, 610) needed to pull down a precharged line 620, 644, 668, 692 from five to two. Each select line drives a total of four transistor gates in each two-bit multiplexer 402 (e.g., line S[0]0 is used to drive transistors 602, 626, 650 and 674). When compared with FIG. 3, wherein each select line of the one-bit multiplexer 102 drives a total of four gates, one can see that the load on a select line shifting two bits is reduced by a factor of two.

One should also note that a precharged line 620, 644, 668, 692 may be pulled down more quickly (thus asserting a buffered output line 622, 646, 670, 694) via a two transistor path than a three transistor path. Circuits may thus be timed closer to clock edges.

Note that an encoding of N variables on $2^N$ lines presumes that any combination of the N variables is likely to occur, as is shown in the VARIABLES column 302 of FIG. 3. With regards to data variables, this is usually the case. However, it is envisioned that in some situations, a designer might be able to rule out the occurrence of certain combinations of variables. For instance, assume that variables A[4] and A[5] of FIG. 3, column 302, identify a pair of shift select lines. It is certainly possible that one might wish to use combinations of these shift select lines to shift data to one of three positions (i.e., S[0], S[16], S[32]) rather than one of four positions (i.e., S[0], S[16], S[32], S[48]). In such a case, one of the variables' combinations (i.e., the combination wherein both variables are asserted) may be ruled out, and conversion of the two variables (A[4] and A[5]) to a 1-of-$2^N$ format results in a fourth wire which never fires. The unused wire may therefore be dropped, without departing from the teachings of the invention.

In tested prototypes, shift line capacitance per square has been reduced from 5 pF to 1 pF using 1-of-$2^N$ encoding. Since power is proportional to the number of lines transitioning, and the load on each transitioning line, both of which are decreased in 1-of-$2^N$ encoding, significant power savings have also been realized (in regards to both data lines 412, 414, 416 and select lines 418, 420, 422).

The total number of transistors 602–616, 626–640, 650–664, 674–688 used in the preferred implementation of a two-bit 1-of-$2^N$ encoded multiplexer 402 (not including buffer and/or precharge/evaluate transistors 618, 642, 666, 690) is thirty-two. A one-bit multiplexer implemented with mousetrap logic requires twenty-four transistors 200–222, 224–246. 1-of-$2^N$ encoding therefore results in a one-third reduction in the required number of transistors needed to implement multiplexer logic 624, 648, 672, 696 (32 transistors versus 48 transistors).

Figure 7:
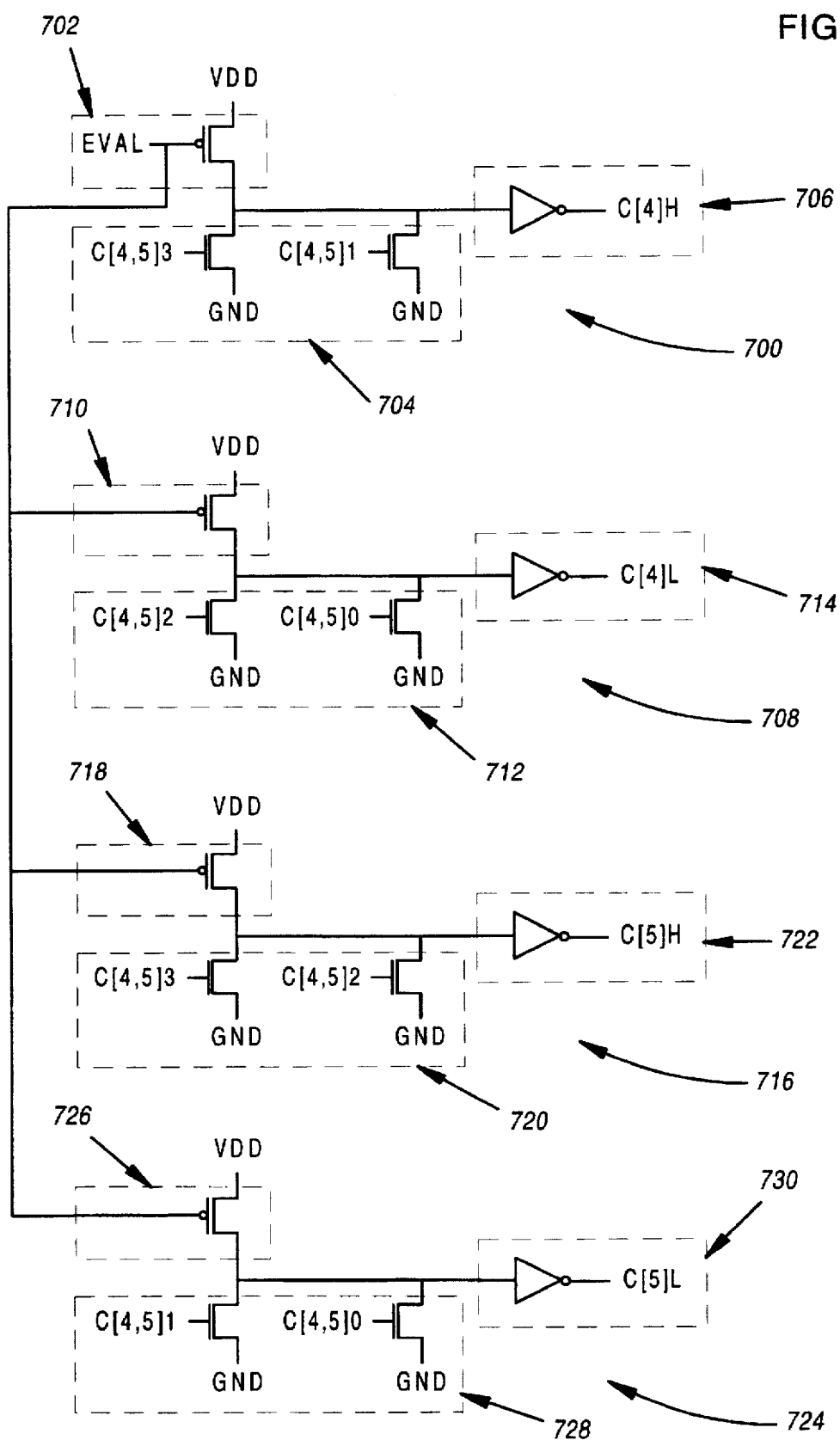
FIG. 7 is a schematic illustrating circuitry for converting from 1-of-$2^N$ logic back to mousetrap logic.

1-of-$2^N$ logic is particularly advantageous in any situation wherein shifts are being made in multiples of two. In a 64-bit shifter having S16 (stage A), S4 (stage B) and S1 (stage C) multiplexed stages 428, 430, 432 (as in FIG. 4), 1-of-$2^N$ logic should be used in the S16 and S4 stages 428, 430. However, it is preferable to convert back to mousetrap logic prior to entering the S1 stage 432. Not only does 1-of-$2^N$ logic become complex in the S1 stage 432, but the reasons for its use in the first place (high density wiring and lengthy wire routings) are not present in the lower density, smaller shift S1 stage 432. Noise and power consumption in the S1 stage 432 are minimal when compared with the noise and power consumption of the S4 and S16 stages 428, 430. A simple conversion technique is illustrated in FIG. 7. 1-of-$2^N$ encoded variables are ORed together in a series of dynamic precharge circuits 700, 708, 716, 724 in order to separate the 1-of-$2^N$ encoded variables 704, 712, 720, 728 into individual mousetrap variables 706, 714, 722, 730. Conversion prior to entering the S1 stage 432 allows S1 multiplexers 406, 407 to be designed using conventional mousetrap logic.

Figure 8:
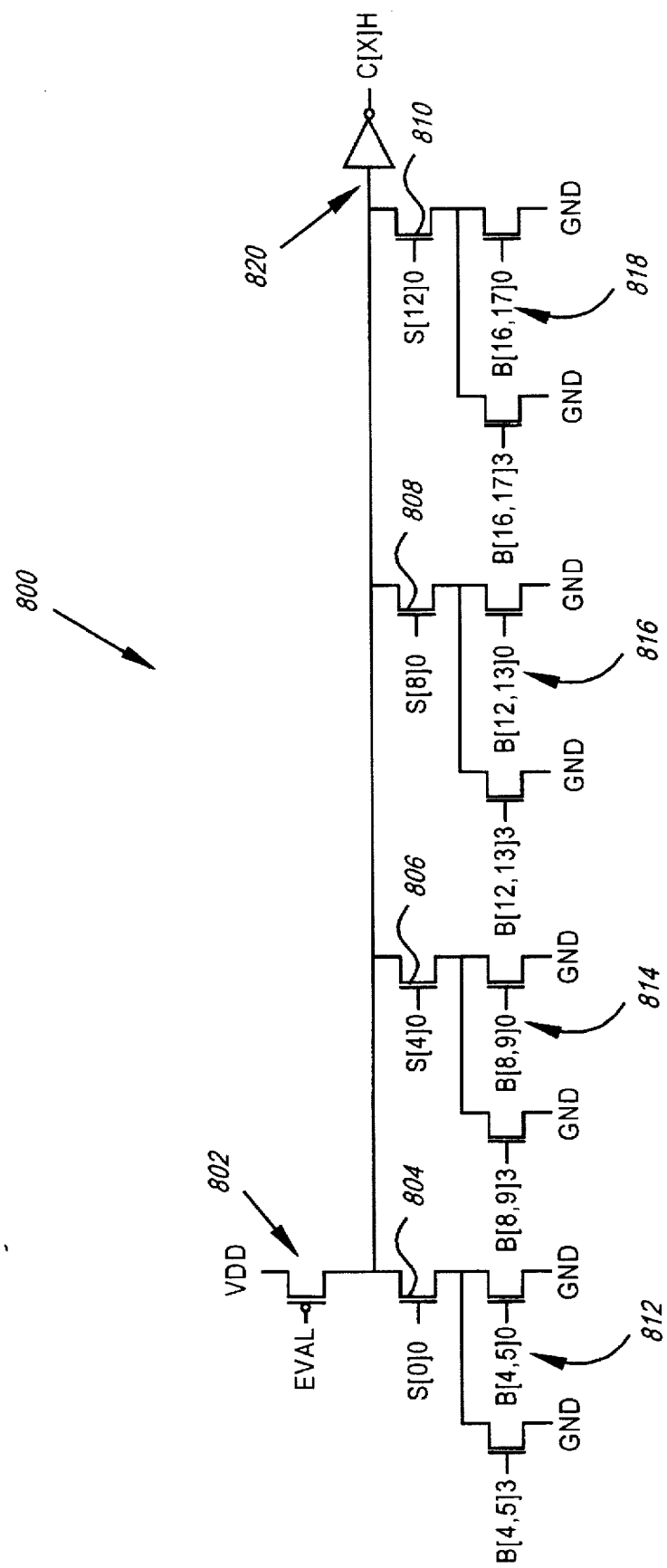
FIG. 8 is a schematic illustrating alternative circuitry for converting from 1-of-$2^N$ logic back to mousetrap logic.

Alternatively, conversion can be merged with the logic of the S4 stage multiplexers 404, 405. Conversion within the S4 stage 430 reduces the number of pullup transistors 802 (precharge circuits) needed to implement an entire shift register 400 or the like (precharge circuits 702, 710, 718 & 726 are eliminated when using the conversion method illustrated in FIG. 8). This is advantageous since it eliminates a gate delay and associated hardware. S4 conversion also reduces the number of buffers 820 (inverters) through which a signal must pass. An implementation 800 of the S4 stage multiplexing of a 1-of-$2^N$ "zero" line, combined with 1-of-$2^N$ to mousetrap conversion within the S4 stage 430, is shown in FIG. 8. Note that the greatest number of series-connected logic gates 804/812, 806/814, 808/816, 810/818 is still no greater than two. Thus, conversion within the S4 stage can be done without undue loading of the select lines.

While illustrative and presently preferred embodiments of the invention have been described in detail herein, it is to be understood that the inventive concepts may be otherwise variously embodied and employed and that the appended claims are intended to be construed to include such variations except insofar as limited by the prior art. Notably, the above discussion has discussed 64-bit shift registers. However, 1-of-$2^N$ encoding may be employed in shift registers and wiring intensive buses of varying lengths and shift amounts, including bidirectional shift registers and the like.

What is claimed is:

1. A method of encoding a plurality of logic paths, the method comprising the steps of:
   a) subdividing the logic paths into groups of N logic paths, N being greater than one;
   b) encoding each group of N logic paths such that,
      i) assertion of a given combination of the N logic paths results in a predetermined one out of $2^N$ signal lines being asserted;
      ii) a simultaneous assertion of more than one of the $2^N$ signal lines is defined as invalid; and
      iii) a simultaneous non-assertion of all of the $2^N$ signal lines enables precharging of the signal lines.

2. A method as in claim 1, wherein each of the signal lines is a buffered output line.

3. A method as in claim 2 wherein the step of encoding each group of N logic paths comprises the steps of:
   a) connecting a precharge/evaluation circuit to each of the buffered output lines; and
   b) connecting ANDed combinations of logic paths to each of the buffered output lines.

4. A method as in claim 1, wherein each logic path comprises high and low mousetrap lines.

5. A method as in claim 1, wherein N=2.

6. A self-timed dynamic shift register comprising one or more stages of tiered multiplexers coupled to perform a shift function, each of said multiplexers comprising a plurality of data inputs and shift amount inputs, wherein various of said inputs comprise groups of $2^N$ signal wires, N being an integer greater than one which is equal to a number of variables encoded in 1-of-$2^N$ format on a group of $2^N$ signal wires.

7. A self-timed dynamic shift register as in claim 6, wherein only a number of said shift amount inputs comprise groups of $2^N$ signal wires.

8. A self-timed dynamic shift register as in claim 6, wherein only a number of said data inputs comprise groups of $2^N$ signal wires.

9. A self-timed dynamic shift register as in claim 6, wherein all of said inputs comprise groups of $2^N$ signal wires.

10. A self-timed dynamic shift register as in claim 6, wherein the shift register comprises first, second and third stages of tiered multiplexers, each stage comprising a plurality of multiplexers, wherein the data inputs of said third stage do not comprise groups of $2^N$ signal wires.

11. A self-timed dynamic shift register as in claim 10, further comprising means to convert data entering the third stage of multiplexers from 1-of-$2^N$ format to either mousetrap/dual-rail or single rail form.

12. A self-timed dynamic shift register as in claim 11, wherein the conversion means comprises logic within the second stage of multiplexers.

13. A self-timed dynamic shift register as in claim 6, wherein N=2.

14. A multiplexer comprising a plurality of data inputs and shift amount inputs, each input comprising a group of $2^N$ signal wires, N being an integer greater than one which is equal to a number of variables encoded in 1-of-$2^N$ format on a group of $2^N$ signal wires.

15. A multiplexer as in claim 14, wherein N=2.

\* \* \* \* \*